US011237682B2

(12) United States Patent
Wu et al.

(10) Patent No.: US 11,237,682 B2
(45) Date of Patent: Feb. 1, 2022

(54) TOUCH SUBSTRATE, TOUCH SCREEN AND ELECTRONIC DEVICE HAVING ELECTRO-STATIC DISCHARGE PROTECTIVE CAPABILITY

(71) Applicants: Chengdu BOE Optoelectronics Technology Co., Ltd., Sichuan (CN); BOE Technology Group Co., Ltd., Beijing (CN)

(72) Inventors: Jianjun Wu, Beijing (CN); Zewen Li, Beijing (CN); Hongqiang Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/767,882

(22) PCT Filed: Apr. 2, 2019

(86) PCT No.: PCT/CN2019/081013
§ 371 (c)(1),
(2) Date: May 28, 2020

(87) PCT Pub. No.: WO2020/199122
PCT Pub. Date: Oct. 8, 2020

(65) Prior Publication Data
US 2021/0232266 A1  Jul. 29, 2021

(51) Int. Cl.
*G06F 3/044* (2006.01)
*H01L 27/32* (2006.01)
(Continued)

(52) U.S. Cl.
CPC .......... *G06F 3/0446* (2019.05); *H01L 27/323* (2013.01); *H01L 27/3244* (2013.01);
(Continued)

(58) Field of Classification Search
CPC ............................. G06F 3/0446; H01L 27/323
See application file for complete search history.

(56) References Cited

U.S. PATENT DOCUMENTS

2012/0229749 A1  9/2012  Nishimura et al.
2016/0103548 A1*  4/2016  Jun .................. G06F 3/0412
                                                        345/173
(Continued)

FOREIGN PATENT DOCUMENTS

CN  105138163 A  12/2015
CN  105183221 A  12/2015

*Primary Examiner* — Chun-Nan Lin
(74) *Attorney, Agent, or Firm* — Nath, Goldberg & Meyer; Joshua B. Goldberg (57) ABSTRACT

The present disclosure provides a touch substrate including: a base substrate including a first surface and a second surface opposite to each other; a touch component disposed on the first surface of the base substrate; and an electro-static discharge protection means disposed outside the touch component. The electro-static discharge protection means includes: a first protection portion disposed on the first surface of the base substrate; a second protection portion disposed in a different layer from the first protection portion; and a connection portion connecting the first protection portion with the second protection portion. The present disclosure further provides a touch screen and an electronic device.

17 Claims, 7 Drawing Sheets

(51) Int. Cl.
  *H01L 51/00* (2006.01)
  *H01L 51/52* (2006.01)
(52) U.S. Cl.
  CPC ...... *H01L 51/0097* (2013.01); *H01L 51/5237* (2013.01); *G06F 2203/04102* (2013.01); *G06F 2203/04107* (2013.01); *G06F 2203/04111* (2013.01); *H01L 2251/5338* (2013.01)

(56) References Cited

U.S. PATENT DOCUMENTS

| | | | |
|---|---|---|---|
| 2018/0120999 A1* | 5/2018 | Cheng | G06F 3/0412 |
| 2018/0121002 A1* | 5/2018 | Kim | H01L 27/323 |
| 2019/0036073 A1* | 1/2019 | Yu | H01L 27/124 |

* cited by examiner

TOUCH SUBSTRATE, TOUCH SCREEN AND ELECTRONIC DEVICE HAVING ELECTRO-STATIC DISCHARGE PROTECTIVE CAPABILITY

This is a National Phase Application filed under 35 U.S.C. 371 as a national stage of International Application No. PCT/CN2019/081013, filed on Apr. 2, 2019, which is hereby incorporated by reference in its entirety.

TECHNICAL FIELD

The present disclosure relates to the field of touch technology, and in particular, to a touch substrate, a touch screen including the same and an electronic device.

BACKGROUND

With the development of display technology, the touch screen (touch panel) technology has entered a period of rapid development. Capacitive touch screens have attracted more and more attention due to their characteristics such as accurate and sensitive positioning, good touch feel and long service life.

SUMMARY

The embodiments of the present disclosure provide a touch substrate, a touch screen and an electronic device, so as to ensure the sufficient Electro-Static Discharge (ESD) protective capability while achieving a narrow border design.

According to one aspect of the present disclosure, provided is a touch substrate, including: a base substrate including a first surface and a second surface opposite to each other; a touch component disposed on a first surface of the base substrate; and an electro-static discharge protection means disposed outside the touch component. The electro-static discharge protection means includes: a first protection portion disposed on the first surface of the base substrate; a second protection portion disposed in a different layer from the first protection portion; and a connection portion connecting the first protection portion with the second protection portion.

According to an embodiment of the present disclosure, the second protection portion may be disposed on the second surface of the base substrate, and the connection portion may connect the first protection portion with the second protection portion via a first via hole disposed in the base substrate.

According to an embodiment of the present disclosure, the first protection portion may include a first opening, and the second protection portion may include a second opening.

According to an embodiment of the present disclosure, the first protection portion and the second protection portion may be both linear, and a line width of the second protection portion may be larger than a line width of the first protection portion.

According to an embodiment of the present disclosure, the touch component may include a plurality of first electrodes and a plurality of second electrodes disposed crosswise.

According to an embodiment of the present disclosure, the first electrode may include a plurality of first sub-electrodes, and the second electrode may include a plurality of second sub-electrodes. A connection bridge structure may be at an intersection of the first electrode and the second electrode.

According to an embodiment of the present disclosure, the connection bridge structure may include: a first connection portion connecting two adjacent first sub-electrodes; an insulation layer disposed on the first connection portion; and a second connection portion disposed on the insulation layer. The second connection portion may be connected to two adjacent second sub-electrodes via a second via hole disposed in the insulation layer.

According to an embodiment of the present disclosure, the touch substrate may further include a bond pad. The first electrode may be connected to the bond pad via a first wiring disposed on the first surface of the base substrate, and the second electrode may be connected to the bond pad via a second wiring disposed on the first surface of the base substrate.

According to an embodiment of the present disclosure, the electro-static discharge protection means may surround the first wiring and the second wiring, and the electro-static discharge protection means may be grounded via the bond pad.

According to an embodiment of the present disclosure, the touch substrate may further include a protective wiring which is linear and disposed on the first surface of the base substrate to surround the touch component, the first wiring and the second wiring, and disposed between the first and second wirings and the first protection portion of the electro-static discharge protection means.

According to an embodiment of the present disclosure, the protective wiring may be connected to the bond pad and may include a third opening.

According to an embodiment of the present disclosure, the electro-static discharge protection means may be linear, and a line width of the electro-static discharge protection means may be twice or more times of a line width of at least one of the first wiring and the second wiring.

According to an embodiment of the present disclosure, the line widths of the first wiring and the second wiring may be 4 µm to 6 µm.

According to an embodiment of the present disclosure, the second protection portion may be formed as a grounded metal layer with an opening on the second surface of the base substrate, and an orthographic projection of the second protection portion on the first surface of the base substrate may cover a gap between the first wirings, a gap between the second wirings and a gap between the first wiring and the second wiring.

According to an embodiment of the present disclosure, the touch substrate has a cutting margin no more than 100 µm.

According to another aspect of the present disclosure, provided is a touch screen, including the touch substrate according to the present disclosure.

According to an embodiment of the present disclosure, the touch screen may further include a display panel, and the touch substrate may be disposed on the light emitting side of the display panel.

According to an embodiment of the present disclosure, the display panel may be an Organic Light-Emitting Diode (OLED) display panel.

According to an embodiment of the present disclosure, the OLED display panel may include: a flexible substrate; an OLED device disposed on the flexible substrate; and a packaging film layer. The touch substrate may be disposed on the packaging film layer.

According to another aspect of the present disclosure, an electronic device is provided, including the touch screen according to the present disclosure.

BRIEF DESCRIPTION OF THE DRAWINGS

In order to illustrate the embodiments of the present disclosure more clearly, the embodiments of the present disclosure will be described in detail below with reference to the accompanying drawings. It should be appreciated that the accompanying drawings described are only used to illustrate the embodiments of the present disclosure but not limit the scope of the present disclosure. In the drawings.

DETAILED DESCRIPTION

Hereinafter, various exemplary embodiments of the present disclosure will be described more fully with reference to the accompanying drawings. However, the present disclosure may be implemented in many different forms and should not be construed as being limited to the embodiments illustrated herein. Rather, these embodiments are provided so that this description will be thorough and complete and will fully convey the scope of the present disclosure to those skilled in the art. In the figures, the sizes and relative sizes of layers and regions may be exaggerated for clarity.

It should be understood that when an element or a layer is referred to as being "above" another element or layer, "over" another element or layer, "on" another element or layer, "connected to" or "coupled to" another element or layer, it may be directly above another element or layer, directly over another element or layer, directly on another element or layer, directly connected to or directly coupled to another element or layer, or there may be an intermediate element or layer. In contrast, when an element is referred to as being "directly above" another element or layer, "directly over" another element or layer, "directly on" another element or layer, "directly connected to" or "directly coupled to" another element or layer, there is no intermediate element or layer. The same reference numbers always refer to the same elements. As used herein, the term "and/or" includes any and all combinations of one or more of the associated listed items.

It should be understood that the terms such as "first", "second", etc. may be used herein to describe a plurality of elements, components, regions, layers and/or portions, but these elements, components, regions, layers and/or portions should not be limited by these terms. These terms are only used to distinguish one element, component, region, layer or portion from another region, layer or portion. Therefore, a first element, a first component, a first region, a first layer or a first portion discussed below may be referred to as a second element, a second component, a second region, a second layer or a second portion, and vice versa, without departing from the concept of the present invention.

In order to further increase a screen occupation ratio to achieve a full screen, more stringent requirements are imposed on a border width of a display screen. For example, widths of the left and right borders of the display screen are expected to be 0.5 mm or less, A critical factor restricting further reduction of the border of the touch screen is a cutting margin for forming the touch substrate.

The cutting margin of a traditional solution needs to be 300 μm, which includes a safe distance of the ESD. On the other hand, the cutting margin of a laser cutting technical solution may be reduced to 100 μm, but a risk of the ESD is very large. Especially for a touch substrate with extremely thin metal traces (for example, line width of 5 μm) and conductive bridge structures, it is very easy to damage the bridge points and open the traces after encountering the ESD. Furthermore, in the existing display screen with narrow border design, especially in the three-dimensional display screen, a light leakage problem occurs at screen edges.

Figure 1:
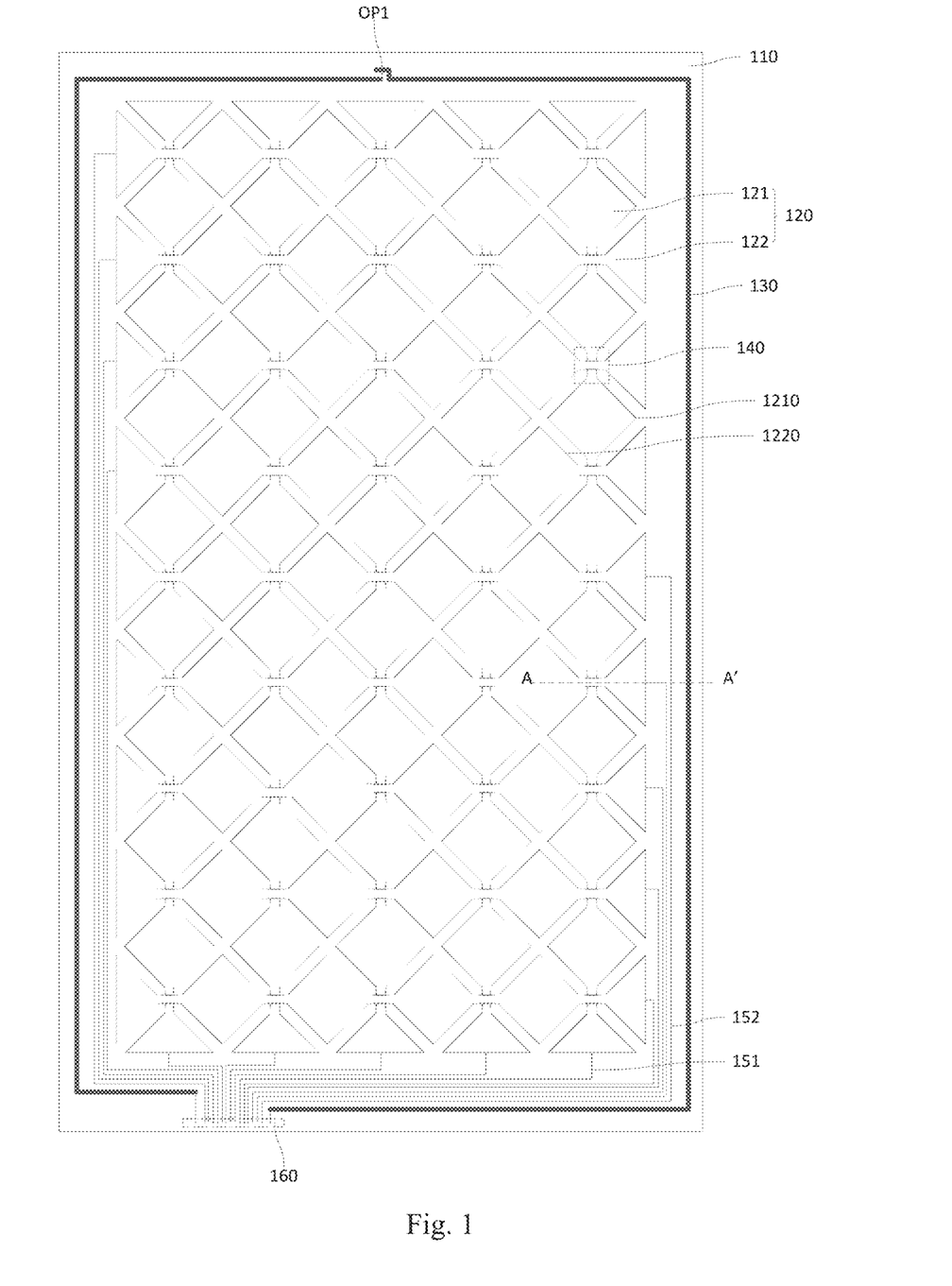
FIG. 1 shows a top view of a touch substrate for illustrating the ESD protective system.
Figure 2:
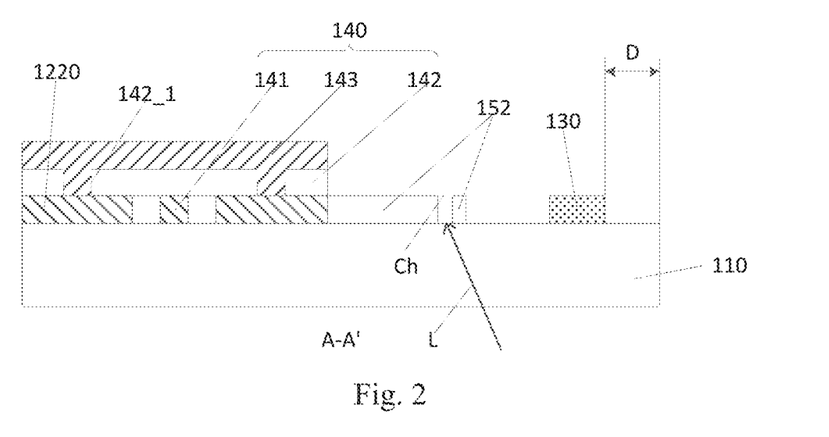
FIG. 2 is a cross-sectional view taken along the line A-A' of FIG. 1.

FIG. 1 shows a top view of a touch substrate for illustrating the ESD protective system, and FIG. 2 is a cross-sectional view taken along the line A-A' of FIG. 1.

Referring to FIGS. 1 and 2, the touch substrate includes a base substrate 110, a touch component 120, an Electro-Static Discharge (ESD) protection means 130 and a bond pad 160. The touch component 120 is disposed on the base substrate 110 and is provided with a first electrode 121 and a second electrode 122. For example, the first electrode 121 may be a driving electrode for receiving a drive signal through a first wiring 151, and the second electrode 122 may be a sensing electrode for providing a sensing signal through a second wiring 152. The first electrode 121 is connected to the bond pad 160 via the first wiring 151 and the second electrode 122 is connected to the bond pad 160 via the second wiring 152.

The first electrode 121 includes a plurality of first sub-electrodes 1210 and the second electrode 122 includes a plurality of second sub-electrodes 1220. A connection bridge structure 140 is formed at AN intersection of the first electrode 121 and the second electrode 122. As shown in FIG. 2, the connection bridge structure 140 includes a first connection portion 141 connecting two adjacent first sub-electrodes, an insulation layer 142 disposed on the first connection portion 141, and a second connection portion 143 disposed on the insulation layer 142. The second connection portion 143 is connected to two adjacent second sub-electrodes 1220 through via holes 142_1 disposed in the insulation layer 142.

The ESD protection means 130 is disposed on a surface of the base substrate 110 where the touch component 120 is provided, and surrounds the touch component 120, the first wiring 152 and the second wiring 152. The ESD protection means 130 is grounded via the bond pad 160, and includes an opening OP1 to form an ESD draining channel. The first wiring 151 and the second wiring 152 may be extremely thin metal traces, and line widths of the first wiring 151 and the second wiring 152 may be in the range of 4 μm to 6 μm, for example, the line widths of the first wiring 151 and the second wiring 152 may be about 5 μm. A line width of the ESD protection means 130 may be twice or more times of the line widths of the first wiring 151 and the second wiring 152.

The cutting margin D is maintained between the ESD protection means 130 and edges of the base substrate 110. In the related art, the cutting margin D is about 300 μm, which includes a safe distance of the ESD. The touch substrate shown in FIG. 1 may withstand the ESD impact of about 10 KV. The laser cutting technical solution may reduce the cutting margin to about 100 µm but may cause a greater ESD risk. Especially for the touch substrate with the extremely thin metal traces (for example, the first wiring 151 and the second wiring 152) and the conductive bridge structures (for example, the connection bridge structure 140), it is very easy to damage the bridge points and open the traces after encountering the ESD.

In addition, referring to FIG. 2, for a touch substrate with narrow border, light L reflected by the edges of the display panel and an optical adhesive may be transmitted from a gap Ch between the metal traces, causing the light leakage at the screen edge. This phenomenon is particularly serious in a three-dimensional display screen.

An embodiment of the present disclosure provides a touch substrate, so as to ensure a sufficient ESD protective capability while achieving a narrow border design (i.e., reducing the safe distance of the ESD). In addition, according to the touch substrate of the embodiment of the present disclosure, the problem of light leakage at the screen edge can be prevented effectively for the narrow border design.

Figure 3:
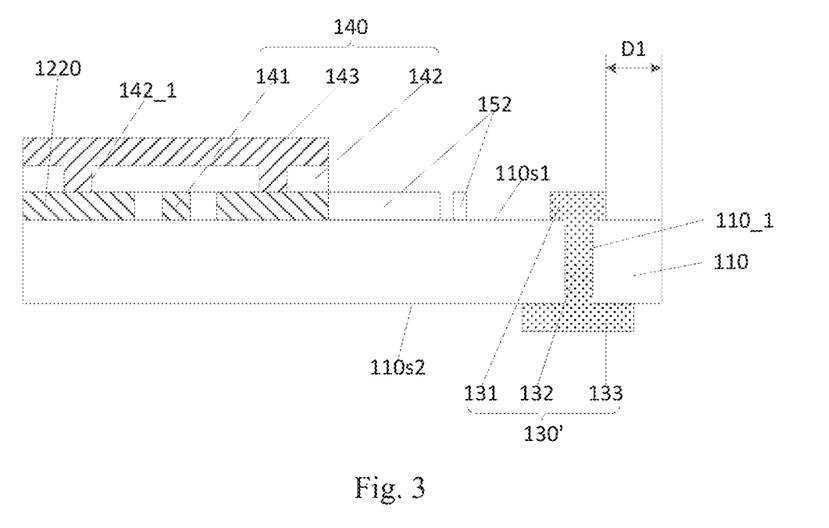
FIG. 3 illustrates a cross-sectional view of a touch substrate according to an embodiment of the present disclosure.
Figure 4:
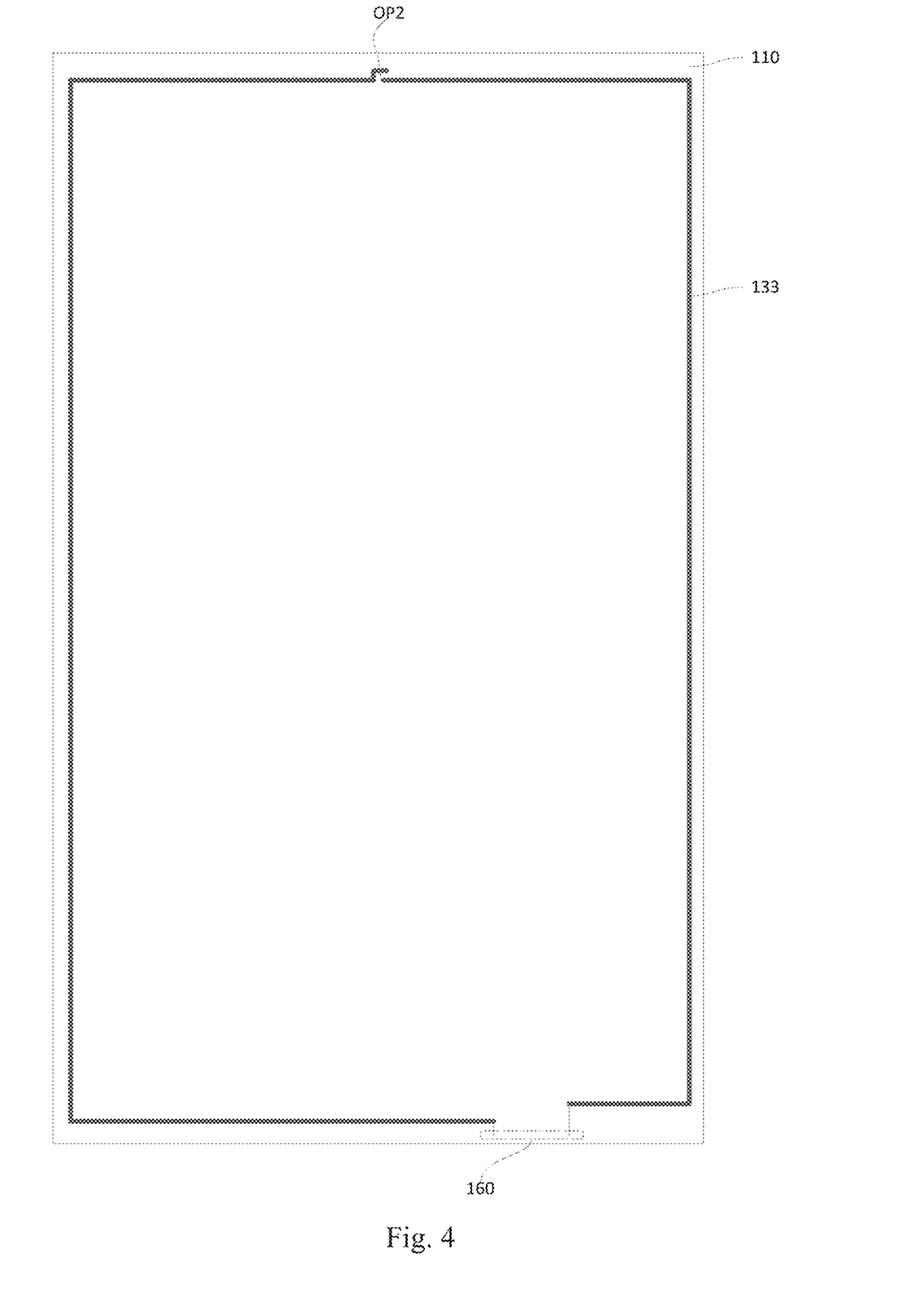
FIG. 4 illustrates a bottom view of a touch substrate according to an embodiment of the present disclosure.

FIG. 3 illustrates a cross-sectional view of a touch substrate according to an embodiment of the present disclosure, and FIG. 4 illustrates a bottom view of a touch substrate according to an embodiment of the present disclosure.

The touch substrate according to an embodiment of the present disclosure includes an ESD protection means 130' without changing the structure of the touch substrate.

Referring to FIGS. 3 and 4, the touch substrate according to the embodiment of the present disclosure includes: a base substrate 110 including a first surface 110s1 and a second surface 110s2 opposite to each other; a touch component 120 disposed on the first surface 110s1 of the base substrate 110; and an ESD protection means 130' disposed outside the touch component 120.

Referring to FIG. 3, the ESD protection means 130' includes: a first protection portion 131 disposed on the first surface 110s1 of the base substrate 110, a second protection portion 133 disposed on the second surface 110s2 of the base substrate 110, and a connection portion 132 connecting the first protection portion 131 with the second protection portion 133 via a via hole 110_1 disposed in the base substrate 110. However, the present disclosure is not limited thereto. According to an embodiment of the present disclosure, the first protection portion 131 may be disposed on the first surface 110s1 of the base substrate 110, the second protection portion 133 may be disposed in a different layer from the first protection portion 131, and the connection portion 132 only needs to be able to connect the first protection portion 131 with the second protection portion 133. According to an embodiment of the present disclosure, the ESD protection means may include two or more protection portions respectively disposed in different layers, and individual protection portions may be connected via the connection portion. In the context of the present disclosure, two elements "disposed in different layers" means that the two elements are disposed on different sides of the same film layer, or the two elements may be formed through different patterning processes.

According to an embodiment of the present disclosure, the first protection portion 131 may include a first opening OP1 (see FIG. 1), and the second protection portion 133 may include a second opening OP2 (see FIG. 4).

According to an embodiment of the present disclosure, a line width of the second protection portion 133 may be larger than a line width of the first protection portion 131. In the context of the present disclosure, "the line width of the ESD protection means" is the smaller one of the line width of the first protection portion and the line width of the second protection portion. For example, as shown in FIG. 3, the line width of the ESD protection means 130' is the line width of the first protection portion 131. According to an embodiment of the present disclosure, the line width of the ESD protection means 130' may be twice or more times of the line width of at least one of the first wiring 151 and the second wiring 152. The first wiring 151 and the second wiring 152 may be extremely thin metal traces, and the line widths of the first wiring 151 and the second wiring 152 may be in the range of 4 µm to 6 µm, for example, the line widths of the first wiring 151 and the second wiring 152 may be about 5 µm.

Similar to the technical solution shown in FIG. 1, the first protection portion 131 and the second protection portion 133 of the ESD protection means 130' may surround the first wiring 151 and the second wiring 152, and the ESD protection means 130' may be grounded via the bond pad 160. However, the present disclosure is not limited thereto, and the ESD protection means may un-completely surround (or only partially surround) the touch component 120 as well as the first wiring 151 and the second wiring 152.

A cutting margin D1 is maintained between the ESD protection means 130' and edges of the base substrate 110. According to an embodiment of the present disclosure, the cutting margin D1 may be about 100 µm.

According to an embodiment of the present disclosure, an equivalent conductive area of the ESD protection means is increased and the ESD protective capability is improved greatly without changing the structure of the touch substrate. According to an embodiment of the present disclosure, the touch substrate having the conductive bridge structures can withstand the ESD impact of 15 KV or more. In addition, the cutting margin is reduced and the line width of the ESD protection means can be further reduced, so it is beneficial to the requirement of the narrow border design and may not cause the ESD defect.

Figure 5:
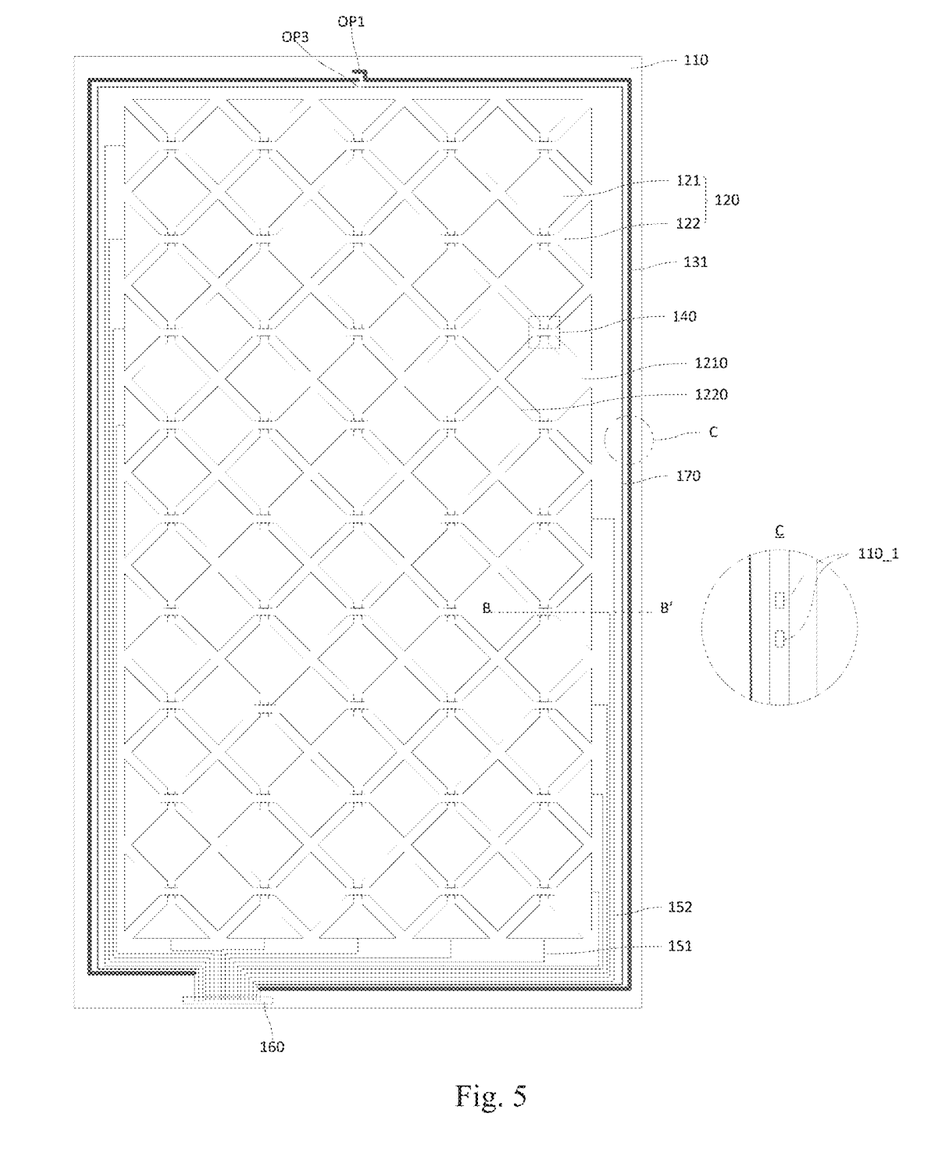
FIG. 5 illustrates a top view of a touch substrate according to an embodiment of the present disclosure.
Figure 6:
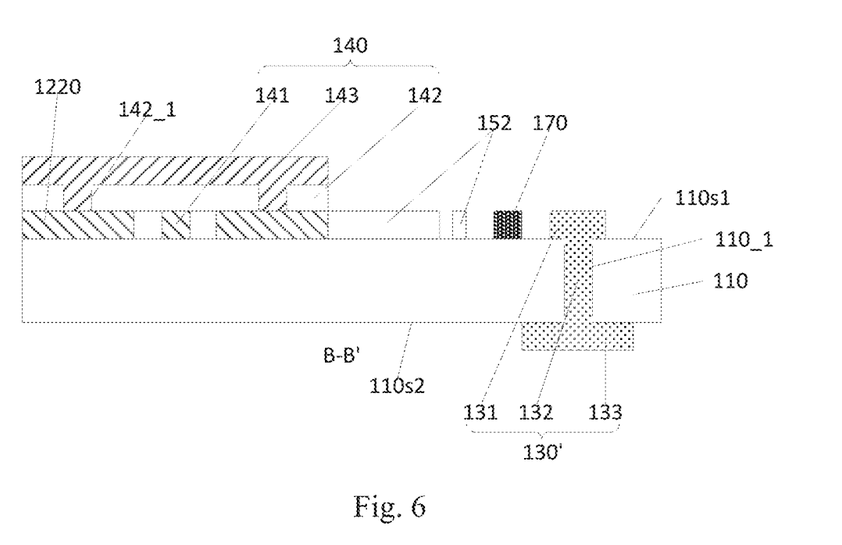
FIG. 6 is a cross-sectional view taken along the line B-B' of FIG. 5.

FIG. 5 illustrates a top view of a touch substrate according to an embodiment of the present disclosure, and FIG. 6 is a cross-sectional view taken along the line B-B' of FIG. 5.

Compared to the embodiment of the present disclosure described with reference to FIGS. 1, 3 and 4, the touch substrate according to the embodiment shown in FIGS. 5 and 6 may further include a protective wiring 170.

Referring to FIGS. 5 and 6, the protective wiring 170 may be disposed on the first surface 110s1 of the base substrate 110 to surround the touch component 120, the first wiring 151 and the second wiring 152, and the protective wiring 170 may be disposed between the first and second wirings 151 and 152 and the first protection portion 131 of the ESD protection means 130'.

According to an embodiment of the present disclosure, the protective wiring 170 may be connected to the bond pad 160 and may include a third opening OP3. The protective wiring 170 may further improve the ESD protective capability.

Figure 7:
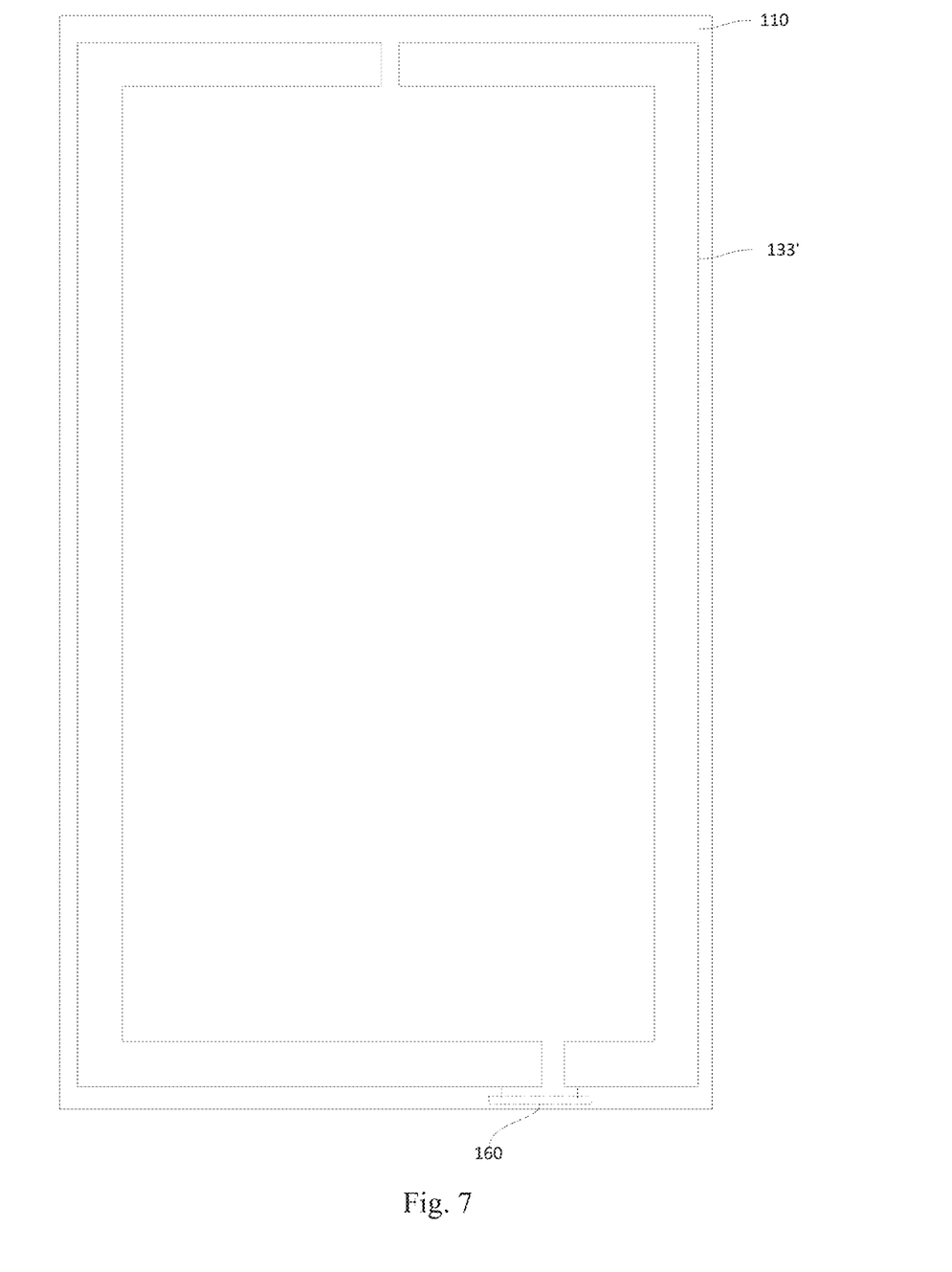
FIG. 7 illustrates a bottom view of a touch substrate according to an embodiment of the present disclosure.
Figure 8:
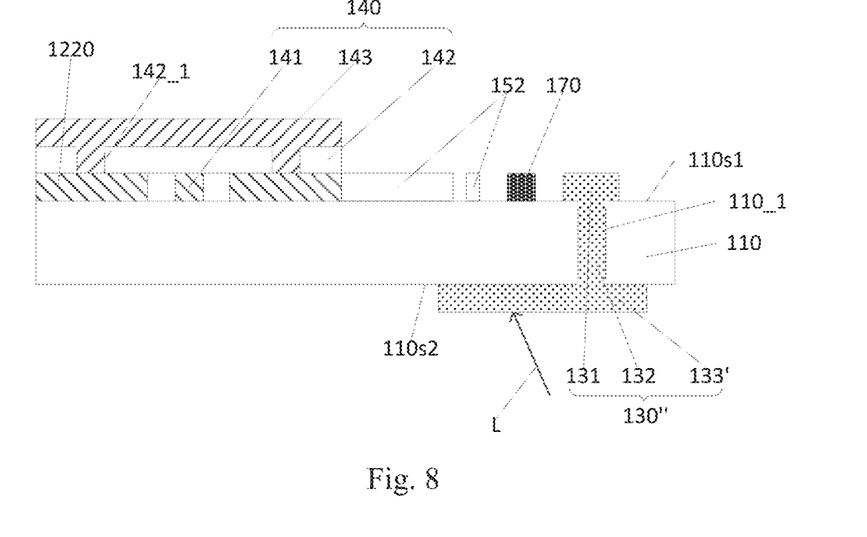
FIG. 8 illustrates a cross-sectional view of a touch substrate according to an embodiment of the present disclosure.

FIG. 7 illustrates a bottom view of a touch substrate according to an embodiment of the present disclosure, and FIG. 8 illustrates a cross-sectional view of a touch substrate according to an embodiment of the present disclosure.

Compared to the embodiment of the present disclosure described with reference to FIGS. 5 and 6, the ESD protection means 130" of the touch substrate according to the embodiment shown in FIGS. 7 and 8 includes: a first protection portion 131 disposed on the first surface 110s1 of the base substrate 110, a second protection portion 133' disposed on the second surface 110s2 of the base substrate 110, and a connection portion 132 connecting the first protection portion 131 with the second protection portion 133' via the via holes 110_1 disposed in the base substrate 110. The second protection portion 133' is formed as an entire grounded metal layer with an opening on the second surface 110s2 of the base substrate 110. The second protection portion 133' may be formed on the second surface 110s2 of the base substrate 110 by printing, film plating, etching or the like, which process is simple and easy. An orthographic projection of the second protection portion 133' on the first surface 110s1 of the base substrate 110 may cover a gap between the first wirings 151 and a gap between the second wirings 152 to prevent the light L reflected by the edges of the display panel and the optical adhesive from being transmitted through the gap between the first wirings 151 and the gap between the second wirings 152, thereby preventing the light leakage at the screen edges.

According to the touch substrate of the embodiments of the present disclosure, the ESD protective capability of the touch substrate is increased by adding a protection means for electro-static discharge on a back of the base substrate without changing the existing structure thereof. In addition, by adopting the touch substrate according to the embodiments of the present disclosure, it facilitates the narrow border design of the touch screen. In addition, according to the touch substrate of the embodiment of the present disclosure, the problem of light leakage at the screen edges can be prevented effectively for the narrow border design.

An embodiment of the present disclosure further provides a touch screen including the touch substrate according to various embodiments of the present disclosure.

According to an embodiment of the present disclosure, the touch screen may further include a display panel, and the touch substrate according to various embodiments of the present disclosure may be disposed on a light emitting side of the display panel, that is, the first electrode 121, the second electrode 122, the first wiring 151 and the second wiring 152 constituting the touch substrate are directly formed on a base of the display panel at the light emitting side. In addition, the first protection portion 131 of the ESD protection means is formed on a surface of the base of the display panel at the light emitting side where the first electrode 121, the second electrode 122, the first wiring 151 and the second wiring 152 are formed, the second protection portion 133 of the ESD protection means is formed on an opposite surface, and a via is formed in the base to form the connection portion 132 connecting the first protection portion 131 with the second protection portion 133.

According to an embodiment of the present disclosure, the display panel may be an OLED display panel. However, the disclosure is not limited thereto, and the display panel may also be a Liquid Crystal Display (LCD) panel, a Quantum Dot Light-Emitting Diode (QLED) panel, or the like.

When the display panel is an OLED display panel, an array substrate in the OLED display panel may include a Thin Film Transistor (TFT) and an anode electrically connected to the drain of the TFT, and include a cathode and an organic material function layer. The organic material function layer includes at least a light emitting layer, and may further include an electron transport layer and a hole transport layer. Based on this, in order to improve the efficiency in injecting the electrons and holes into the light emitting layer, an electron injection layer disposed between the cathode and the electron transport layer and a hole injection layer disposed between the anode and the hole transport layer may further be included. The OLED display panel may further include a packaging layer, which may be a thin film package or a substrate package.

According to an embodiment of the present disclosure, the OLED display panel may include: a flexible substrate, an OLED device disposed on the flexible substrate, and a packaging film layer. The touch substrate according to various embodiments of the present disclosure may be disposed on the packaging film layer, that is, the first electrode 121, the second electrode 122, the first wiring 151 and the second wiring 152 constituting the touch substrate are formed directly on the packaging film layer. In addition, the first protection portion 131 of the ESD protection means is formed on a surface of the packaging film layer where the first electrode 121, the second electrode 122, the first wiring 151 and the second wiring 152 are formed, the second protection portion 133 of the ESD protection means is formed on an opposite surface, and a via is formed in the packaging film layer to form the connection portion 132 connecting the first protection portion 131 with the second protection portion 133. Therefore, the touch screen may be a flexible touch screen.

According to the touch screen of the embodiment of the present disclosure, the ESD protective capability of the touch substrate is increased by adding a protection means for electro-static discharge on the back of the touch screen for forming the base (or film layer) of the touch substrate without changing the existing structure of the touch substrate. In addition, by adopting the touch screen according to the embodiment of the present disclosure, it facilitates the narrow border design. In addition, according to the touch screen of the present disclosure, the problem of light leakage at the screen edge can be prevented effectively for the narrow border design.

An embodiment of the present disclosure further provides an electronic device including the touch screen according to various embodiments of the present disclosure. The electronic device may include, but not limited to, Personal Computer (PC), notebook computer, netbook, Personal Digital Assistant (PDA), smart phone, wireless phone, mobile phone, wearable smart device, e-book, Portable Multimedia Player (PMP), portable game console, navigation device, television, digital audio recorder, digital audio player, digital picture recorder, digital picture player, digital video recorder, digital video player, etc.

Although various embodiments of the present disclosure have been shown and described, it will be apparent to those skilled in the art that various modifications and changes can be made without departing from the spirit and scope of the present disclosure. The protection scope of the present disclosure is intended to cover all such modifications and changes.

The invention claimed is:

1. A touch substrate comprising:
a base substrate comprising a first surface and a second surface opposite to each other;
a touch component disposed on the first surface of the base substrate; and
an electro-static discharge protection component disposed outside the touch component,
wherein the electro-static discharge protection component comprises:
a first protection portion disposed on the first surface of the base substrate;
a second protection portion disposed in a different layer from the first protection portion; and
a connection portion connecting the first protection portion with the second protection portion;

wherein the touch component comprises a plurality of first electrodes and a plurality of second electrodes disposed crosswise;

wherein the touch substrate further comprises a bond pad, the first electrode is connected to the bond pad via the first wiring disposed on the first surface of the base substrate, and the second electrode is connected to the bond pad via a second wiring disposed on the first surface of the base substrate; and wherein the touch substrate further comprises a protective wiring which is linear and disposed on the first surface of the base substrate to surround the touch component, the first wiring and the second wiring, and disposed between the first and second wirings and the first protection portion of the electro-static discharge protection component.

2. The touch substrate according to claim 1, wherein the second protection portion is disposed on the second surface of the base substrate, and the connection portion connects the first protection portion with the second protection portion via a first via hole disposed in the base substrate.

3. The touch substrate according to claim 1, wherein the first protection portion comprises a first opening, and the second protection portion comprises a second opening.

4. The touch substrate according to claim 1, wherein the first protection portion and the second protection portion are both linear, and a line width of the second protection portion is larger than a line width of the first protection portion.

5. The touch substrate according to claim 1, wherein
the first electrode comprises a plurality of first sub-electrodes, and the second electrode comprises a plurality of second sub-electrodes; and
a connection bridge structure is at an intersection of the first electrode and the second electrode.

6. The touch substrate according to claim 5, wherein the connection bridge structure comprises:
a first connection portion connecting two adjacent first sub-electrodes;
an insulation layer disposed on the first connection portion; and
a second connection portion disposed on the insulation layer,
wherein the second connection portion is connected to two adjacent second sub-electrodes via a second via hole disposed in the insulation layer.

7. The touch substrate according to claim 1, wherein the electro-static discharge protection component surrounds the first wiring and the second wiring, and the electro-static discharge protection component is grounded via the bond pad.

8. The touch substrate according to claim 1, wherein the protective wiring is connected to the bond pad and comprises a third opening.

9. The touch substrate according to claim 1, wherein the electro-static discharge protection component is linear, and a line width of the electro-static discharge protection component is twice or more times of a line width of at least one of the first wiring and the second wiring.

10. The touch substrate according to claim 1, wherein line widths of the first wiring and the second wiring are 4 µm to 6 µm.

11. The touch substrate according to claim 1, wherein the second protection portion is formed as a grounded metal layer with an opening on the second surface of the base substrate, and an orthographic projection of the second protection portion on the first surface of the base substrate covers a gap between the first wirings, a gap between the second wirings and a gap between the first wiring and the second wiring.

12. The touch substrate according to claim 1, wherein the touch substrate has a cutting margin no more than 100 µm.

13. A touch screen comprising the touch substrate according to claim 1.

14. The touch screen according to claim 13, further comprising a display panel, and the touch substrate is disposed on a light emitting side of the display panel.

15. The touch screen according to claim 14, wherein the display panel is an Organic Light-Emitting Diode (OLED) display panel.

16. The touch screen according to claim 15, wherein the OLED display panel comprises:
a flexible substrate;
an OLED device disposed on the flexible substrate; and
a packaging film layer,
wherein the touch substrate is disposed on the packaging film layer.

17. An electronic device comprising the touch screen according to claim 13.

* * * * *